(12) United States Patent
Thanvantri et al.

(10) Patent No.: US 7,761,826 B1
(45) Date of Patent: Jul. 20, 2010

(54) METHOD AND SYSTEM FOR CROSSTALK ANALYSIS

(75) Inventors: Venkat Thanvantri, Milpitas, CA (US); Shiva Raja, Chelmsford, MA (US); Igor Keller, Pleasanton, CA (US); Lizheng Zhang, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 404 days.

(21) Appl. No.: 11/782,619

(22) Filed: Jul. 24, 2007

Related U.S. Application Data (60) Provisional application No. 60/833,197, filed on Jul. 24, 2006.

(51) Int. Cl.
*G06F 17/50* (2006.01)
(52) U.S. Cl. .................................. 716/6; 716/4; 716/5
(58) Field of Classification Search .............. 716/4, 716/5, 6
See application file for complete search history.

(56) References Cited

U.S. PATENT DOCUMENTS 7,392,493 B2 * 6/2008 Alpert et al. ............ 716/6

OTHER PUBLICATIONS

Gupta et al.,"Intrabus Crosstalk Estimation Using Word-Level Statistics", Mar. 2005, IEEE Transactions on Computer-Aided Design of Integrated Circuits and Systems, vol. 24, No. 3, pp. 469-478.*
Bhardwaj et al.: "Probability Distribution of Signal Arrival Times Using Bayesian Networks", IEEE Transactions on CAD of Integrated Circuits & Systems.
Bhardwaj et al.: "Estimation of Signal Arrival in the Presence of Delay Noise", IEEE, 2002.
Bhardwaj et al.: "Tau: Timing Analysis Under Uncertainty".
Wilson: "Statistical Timing Steps Into Spotlight at ICCAD". EE Times, Nov. 17, 2003.
Krstic: "Diagnosis of Delay Defects Using Statistical Timing Models", 2003 Proceedings, IEEE 21st VLSI Test Symposium.
Nadas: "Probabilistic Pert". vol. 23, No. 3, May 1979. pp. 339-347.
Pan et al.: "Timing Yield Estimation Using Statistical Static Timing Analysis".
Xiao et al.: Worst Delay Estimation in Crosstalk Aware Static Timing Analysis, IEEE, 2000.

* cited by examiner

*Primary Examiner*—Sun J Lin
(74) *Attorney, Agent, or Firm*—Vista IP Law Group LLP (57) ABSTRACT

Method and system for crosstalk analysis relating to a statistical crosstalk path delay model that fits into existing static timing framework with little overhead in performance and capacity. More realistic models or assumptions are utilized rather than the more aggressive and less likely deterministic model.

20 Claims, 11 Drawing Sheets

```
Path 1: VIOLATED Setup Check with Pin DTMF_INST/TDSP_CORE_INST/EXECUTE_INST_p_
reg_30/CK
Endpoint:  DTMF_INST/TDSP_CORE_INST/EXECUTE_INST_p_reg_30/D            (v)
checked with  leading edge of 'vclk1'
Beginpoint: DTMF_INST/TDSP_CORE_INST/DATA_BUS_MACH_INST/data_out_reg_5/Q (v)
triggered by  leading edge of 'vclk1'
Other End Arrival Time         2.17
- Setup                        0.56
+ Phase Shift                 10.00
- Statistical Crosstalk Adjust -1.00
- Uncertainty                  0.25
= Required Time               11.36
- Arrival Time                21.26
= Slack Time                  -9.90
     Clock Rise Edge                  0.00
     = Beginpoint Arrival Time        0.00
```

| Instance | Arc | Cell | Delay | Arrival Time | Required Time |
|---|---|---|---|---|---|
| DTMF_INST/TEST_CONTROL_INST/i_87396 | Y ^ | | | 0.00 | -9.90 |
| DTMF_INST/m_clk_L1_I0 | A ^ -> Y ^ | BUFX2 | 0.08 | 0.08 | -9.82 |
| DTMF_INST/m_clk_L2_I0 | A ^ -> Y ^ | BUFX2 | 0.10 | 0.18 | -9.72 |
| ..... | | | | | |
| DTMF_INST/TDSP_CORE_INST/MPY_32_INST/i_2881/i_1278 | A0 ^ -> Y v | AOI21X1 | 0.22 | 31.03 | 21.13 |
| DTMF_INST/TDSP_CORE_INST/MPY_32_INST/i_323 | B v -> Y v | MX2X1 | 0.23 | 31.26 | 21.36 |
| DTMF_INST/TDSP_CORE_INST/EXECUTE_INST_p_reg_30 | D v | EDFFX1 | 0.00 | 20.26 | 11.36 |

METHOD AND SYSTEM FOR CROSSTALK ANALYSIS

CROSS-REFERENCE TO RELATED APPLICATIONS

The present application claims the benefit of U.S. Provisional Application No. 60/833,197, entitled "Method and System for Crosstalk Analysis," filed on Jul. 24, 2006, which is hereby incorporated by reference in its entirety.

FIELD OF THE INVENTION

Some embodiments of the invention relate static timing analysis and signal integrity analysis.

BACKGROUND

Crosstalk can cause differences in signal arrival times, i.e., can cause the signal to arrive too early or too late. Static timing analysis involves analyzing whether or not a signal arrives too late or too early so that the signal is sampled at the right time. In order for a design to work effectively, a signal should arrive within a certain window.

Some degree of crosstalk typically exists in every net of a design. Thus, a signal is delayed in every net, and if there are multiple nets, the signal delay can be increased significantly. A conventional way to determine a worst case probability for the signals is, for example, to determine the probability on each net and summed together. However, the worst case scenario rarely occurs, and users have complained that such a model is not desirable because it is too aggressive for something that does not occur that often.

Figure 1:
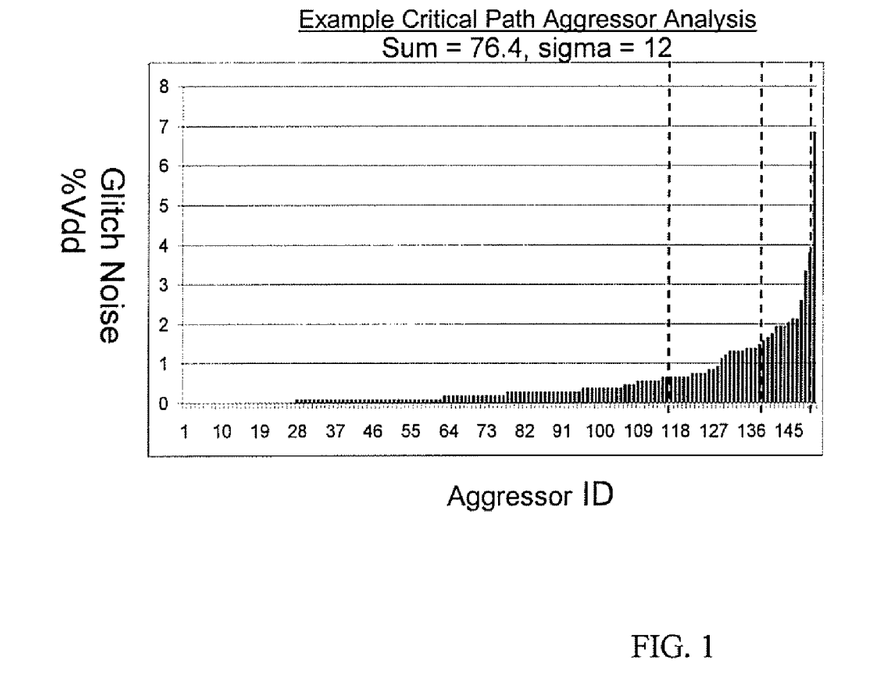
FIG. 1 depicts a bar graph of critical path aggressor analysis.

Conventional noise-on-delay analysis assumes that the worst-case scenario realizable under timing windows and other constraints happens necessarily. This causes cumulative crosstalk delay on critical timing path to be too pessimistic, thereby resulting in difficulties in timing closure. As an example, consider a design in which the most critical path contains 33 logic stages, with 151 total aggressors spread out over those logic stages. Existing timing analysis with crosstalk assumes all 151 aggressors will switch in the opposite direction as their corresponding victims, and also switch at the precise timing with respect to the victim so as to cause the worst case impact on path delay. All of this must happen simultaneously in the same clock cycle. This scenario is very unrealistic, and it is a major reason for difficulties in achieving timing and signal integrity (SI) closure. This is illustrated in FIG. 1, in which the noise contribution of each of the 151 aggressors on the critical path is expressed in glitch noise as percentage of Vdd. The cumulative glitch noise of all aggressors is 76.4% of Vdd, whereas the statistical distribution gives a maximum of only 36% of Vdd with 99% certainty. In real-world designs, this percentage could be much higher due to switching probabilities being much less than 1.0, and the worst case switching alignment probabilities also much less than 1.0. In other words, only 47% of the total crosstalk impact on path delay may be statistically achievable.

Therefore, there is a need for an improved approach for implementing crosstalk analysis, which addresses and improves upon the above-described problems with conventional approaches.

SUMMARY

Embodiments of the invention are directed to methods, systems, and computer program products for analyzing crosstalk in a circuit design. Some embodiments of the invention relate to a statistical crosstalk path delay model that fits into existing static timing framework with little overhead in performance and capacity. More realistic models or assumptions are utilized rather than the more aggressive and less likely deterministic model.

In one implementation, for each net in a design, a probability distribution function (pdf) of the delay is determined. Thus, on every net, there is a delay that has a probability. A pdf table for each aggressor that causes crosstalk can be generated, and the sum or combination of probabilities is determined to describe the probability of a delay of an entire path. After a pdf of the entire path is determined, determinations are made concerning a reasonable probability that a chip will work.

In another implementation, a method for determining the delay caused by crosstalk includes computing a pdf for each aggressor net, combining all of the pdf's into a combined or composite file, receiving a probability input from a user, and determining delay using probability input according to combined probability distribution file.

In a further implementation, deterministic worst case crosstalk delays are computed, and each individual aggressor contribution to delay is stored. Then for each path endpoint that has negative timing slack with crosstalk, crosstalk delay distributions (or sensitivities) are propagated through the fan in cone of that end point. The delay difference between the deterministic crosstalk delay and statistical crosstalk delay is subtracted from the arrival times at the end point as incremental delay (or SDF), and report timing will be able to report the worst paths calculated using this statistical crosstalk delay model.

In a further implementation, options are provided to selectively apply statistical model to crosstalk analysis. With this optional separation of statistical and deterministic checks within the same design, nets that are 'clock' and those that are not 'clock' are tracked.

DETAILED DESCRIPTION

Some embodiments of the invention relate to a system, method, and computer program product for implementing a statistical crosstalk path delay model that fits into existing static timing framework with little overhead in performance and capacity. More realistic models or assumptions are utilized rather than the more aggressive and less likely deterministic model.

For example, for each net in a design, a probability distribution function (pdf) of the delay is determined. Thus, on every net, there is a delay that has a probability. A pdf table for each aggressor that causes crosstalk can be generated, and the sum or combination of probabilities is determined to describe the probability of a delay of an entire path. After a pdf of the entire path is determined, determinations are made concerning a reasonable probability that a chip will work. Thus, according to one embodiment, a method for determining the delay caused by crosstalk includes computing a pdf for each aggressor net, combining all of the pdf's into a combined or composite file, receiving a probability input from a user, and determining delay using probability input according to combined probability distribution file According to one embodiment, deterministic worst case crosstalk delays are computed, and each individual aggressor contribution to delay is stored. Then for each path endpoint that has negative timing slack with crosstalk, crosstalk delay distributions (or sensitivities) are propagated through the fan in cone of that end point. The delay difference between the deterministic crosstalk delay and statistical crosstalk delay is subtracted from the arrival times at the end point as incremental delay (or SDF), and report timing will be able to report the worst paths calculated using this statistical crosstalk delay model.

Options can be provided to selectively apply statistical model to crosstalk analysis. For example, hold checks can be statistically more likely due to the critical hold paths being short, and hold may be a critical failure, therefore one may decide to use deterministic model for hold checks (hold problems are also easier to fix during timing closure). A similar analysis applies for glitch analysis and multiple clocking analyses.

With this optional separation of statistical and deterministic checks within the same design, nets that are 'clock' and those that are not 'clock' are tracked. For clock nets, according to one embodiment, a deterministic worst case analysis is performed. The same analysis can apply to nets in the JO paths, because they also tend to be short, and more importantly slowing down the clock period does not fix timing problems on JO paths, hence making the timing failure critical. Reference is made to FIGS. 2-7 for an understanding of embodiments of the invention.

Noise Path Pessimism Reduction

As is mentioned earlier, calculation of worst case (WC) crosstalk-induced delay (change) on a path for a particular confidence level is analyzed. In one embodiment, if a desired confidence level is 100%, then only the logic and timing constraints are used to reduce pessimism over the existing crosstalk analysis method.

In another embodiment, the existing block-based crosstalk-on-delay analysis is available and the pessimism reduction is used. Moreover, in another embodiment, the analysis is applied on a critical path, where switching directions of all victims are known.

In yet another embodiment, the case of positive delay change is analyzed. The case of negative delay change can also be performed and is substantially similar in its analysis.

In a further embodiment, pessimism reduction is utilized on top of the existing methods by considering two types of constraints which are usually ignored by the conventional block-based method:
1. Logic constraints: aggressors or victims may be connected by some simple gates such that they are not able to switch in an arbitrary pattern. In some approaches, only logical gates of buffers or inverters are considered.
2. Timing constraints: the signal arrival times of aggressors or victims may be subject to some constraints such that they are either limited into a narrower range than their timing windows or no longer independent to each other. Both of these timing constraints make the alignment between aggressor and victim more restricted.

Figure 2:
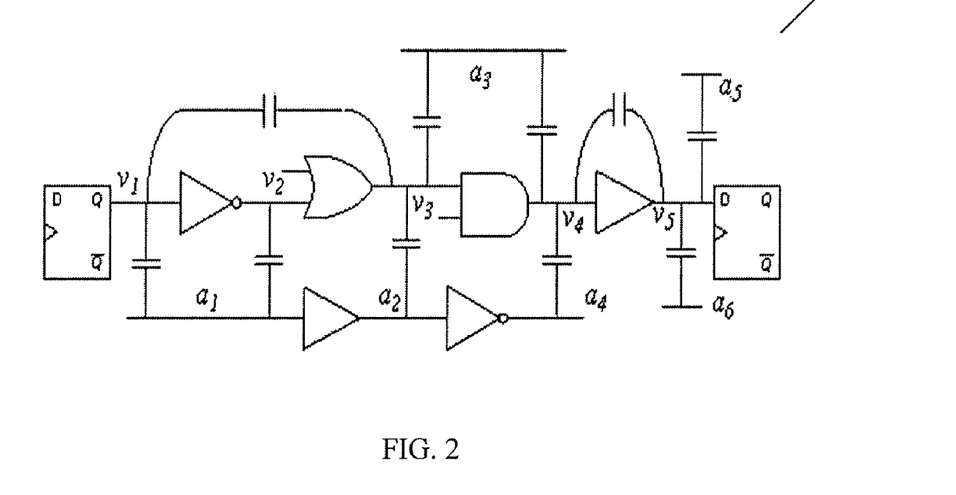
FIG. 2 illustrates three examples of constraints which reduce the pessimism in the crosstalk analysis according to an embodiment of the present invention.

FIG. 2 includes three examples of constraints which reduces the pessimism in the crosstalk analysis 200. As a first example, victim nets v1 and v3 attack each other, and since they have opposite transitions, the crosstalk between the nets may not lead to speedup. Similarly, nets v4 and v5 always transition in the same direction, so the crosstalk here may not cause delay change. Furthermore, in this example, a feasible alignment between nets v1 and v3 or between v4 and v5 vary in a small range, which imposes additional constraints.

Another example is when an aggressor attacks multiple victims. As illustrated in FIG. 2, net a3 attacks both victim nets v3 and v4; therefore, the WC alignment for nets a3 and v3 may not be the worst case alignment for a3 and v4. Another example: net a1 attacks both v1 and v2, but v1 and v2 have different transition directions, so the positive delay change between a1 and v1 must result in negative one between a1 and v2.

In another example, correlations between aggressors v3 and v4 have the same switch directions while a2 and a4 have opposite transitions, so positive delay change on nets a2 and v3 results in negative delay change in a4 and v4. Transition of a1 to v2 and a2 to v3 can both be positive, but the arrival time difference between a1 and a2 is the delay of the buffer connecting them, so the worst case alignment between a1 and v2 may not be the worst case alignment between a2 and v3 due to the timing constraint between a1 and a2.

Switching Probability

In another embodiment, the invention addresses when independent aggressors switch in either directions or even remain quiet when victim is switching. The probability for all independent aggressors to switch in the WC directions can be extremely low if the number of statistically independent aggressors is large. For example, if probabilities for each of 20 aggressors to rise, fall or remain quiet are 0.25, 0.25, 0.5 respectively, the probability of all the aggressors to switch in a particular set of directions is $(0.25)^{20}=0.9\times10-12$.

Figure 3:
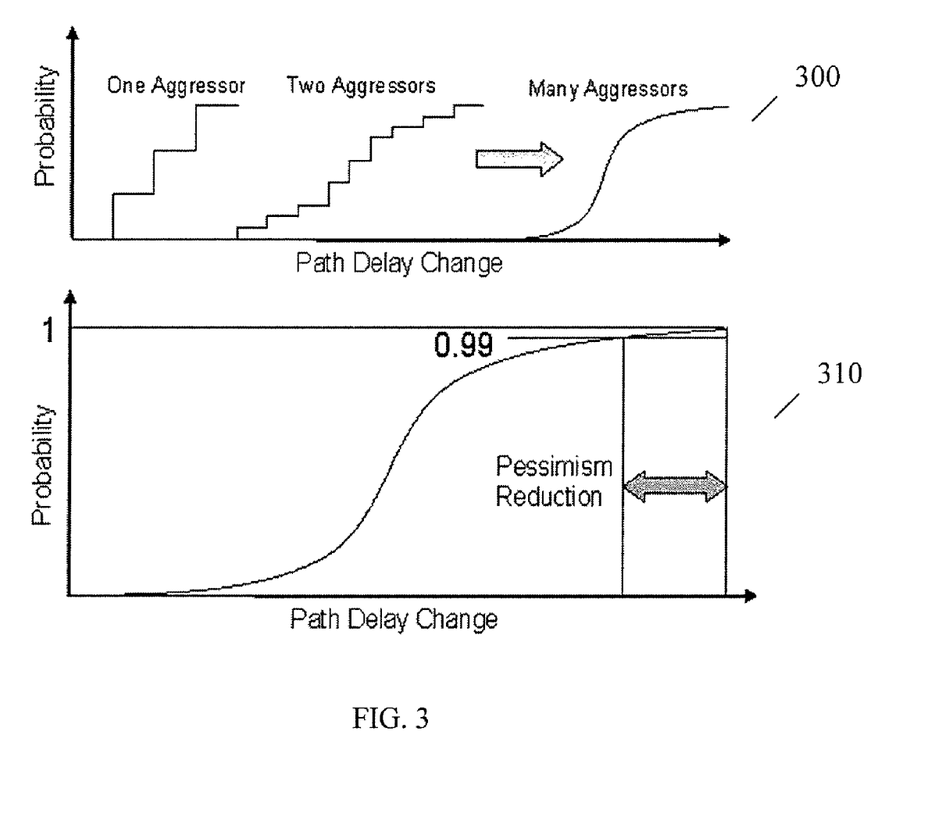
FIG. 3 depicts graphs of probability versus path delay change according to an embodiment of the present invention.
Figure 4:
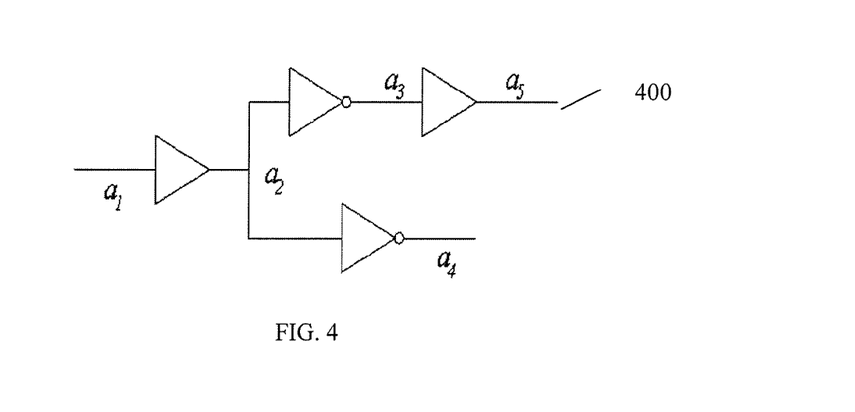
FIG. 4 illustrates an example of a logically correlated aggressor group according to an embodiment of the present invention.

As shown in 300 of FIG. 3, the contribution from one aggressor into delay change on a critical path can be described by a piece-wise constant delay change cumulative distribution function (CDF) consisting of 3 pieces. Similarly, contribution of the delay change from two aggressors can be found by convolving CDFs of each aggressor, so the path delay change CDF then has 9 pieces. Since number of pieces in a CDF grows exponentially with numbers of aggressors, the path delay change CDF will eventually becomes a smooth CDF for sufficiently large number of independent aggressors attacking a critical path.

If some level of confidence is tolerable, i.e., 99%, a significant amount of path delay pessimism can be eliminated as shown in 310 of FIG. 3.

Problem Formulation for NPPR (Noise Path Pessimism Reduction)

In an embodiment, there are N nets in a critical path enumerated from 1 to N along the path. In addition, there are 2N arrival times, N of which are arrival times at each net's driver pin, d1, d2 ... dN and the other N of them are arrival times at each net's receiver pin: r1, r2 ... rN. Each of the victims has a pessimism reduction of R1, R2 ... RN and the actual arrival times of victim n at its driver/receiver pin is expressed as follows:

$$d_n = d_n^0 - \sum_{i=1}^{n-1} R_i \text{ and } r_n r_n^0 - \sum_{i=1}^{n} R_i \quad (1)$$

where $d_n^0$ and $r_n^0$ are the worst case arrival times of victim n at the driver/receiver pin respectively.

If there are totally M aggressors for the path, each of which attacks at least one victim net on the path, the total pessimism reduction on one victim, Rn, is a sum of the victim's pessimism reduction from each aggressor when considered individually.

$$R_n = \sum_{k=1}^{M} R_n^k = \sum_{k=1}^{M} f_{k,n}(a_k - d_n) \quad (2)$$

where a1, a2, ..., aM are attackers' arrival times. The second equality in the above equation means the pessimism reduction for any aggressor-victim pair will be a function of the alignment between the nets, if considered individually and the transition directions of both nets are known. More specifically, if there is no coupling capacitance between the two nets, this function is zero for any alignment.

Note that equation (2) is an approximation since the combined crosstalk effect of multiple aggressors on a victim is non-linear. However, it can be assumed that each aggressor's contribution to the victim's overall pessimism reduction is relatively small; therefore, the linear superposition can be used in 2.

Combining equations (1) and (2), the following can be obtained for net n:

$$R_n = \sum_{k=1}^{M} R_n^k = \sum_{k=1}^{M} f_{k,n}\left(a_k - d_n^0 + \sum_{i=1}^{n-1} R_i\right) \quad (3)$$

If all the aggressors are independent to each other and are also independent to the victims, Equation 3 can be separated, and one can show that no pessimism reduction can be achieved in addition to that found considering each victim net in the order of 1, 2, ..., N, which is the one found in the block-based analysis.

However, since typically some aggressors are not independent to each other and some of them may even be correlated to victims, hence an additional pessimism reduction achieved. In this case, the set of equations 3 can not be separated and an iterative method is used to solve the equations.

In one embodiment, the analysis may be formulated as a two-step process.

First, the process minimizes the path pessimism reduction using the following equation:

$$R_P = \sum_{n=1}^{n} R_n = \sum_{n=1}^{N} \sum_{k=1}^{M} f_{k,n}\left(a_k - d_n^0 + \sum_{i=1}^{n-1} R_i\right) \quad (4)$$

In one embodiment, the minimized reduction is subject to logic and timing correlation among all aggressor and victims and the convergence requirement expressed in equation (3). Then, the process associates each minimum path pessimism reduction with the probability of its corresponding switching combination and construct the CDF of the overall path pessimism reduction $\Phi$ (RP).

Once the CDF of the path pessimism reduction is constructed, the path pessimism reduction at a given confidence level of a can be computed from the CDF as follows:

$$R_P(\alpha) = \Phi^{-1}(1-\alpha) \quad (5)$$

which means the overall path pessimism reduction will be larger than RP ($\alpha$) with a probability of $\alpha$.

Correlated Aggressor Group (CAG)

The second part of the above analysis is performed in which the logic/timing correlation in equation (4) is considered.

Equation (4) can be rearranged equivalently as:

$$R_P = \sum_{k=1}^{M} R^k = \sum_{k=1}^{M} \sum_{n=1}^{N} f_{k,n}\left(a_k - d_n^0 + \sum_{i=1}^{n-1} R_i\right) \quad (6)$$

where the new variable Rk is defined as the kth aggressors contribution to the overall path pessimism reduction:

$$R^k = \sum_{n=1}^{N} f_{k,n}\left(a_k - d_n^0 + \sum_{i=1}^{n-1} R_i\right) \quad (7)$$

The significance of such rearrangement is that the pessimism reduction contribution from correlated aggressors can be grouped together, forming a correlated aggressor group (CAG). Full logic correlation is assumed within a CAG because directions and times of transitions on nets connected through buffers or inverters can be considered as strongly correlated. Moreover, logic and timing correlations happens together, so there will be no dependency between uncorrelated aggressors and the minimization of the overall path pessimism reduction, and can be therefore partitioned to minimize the pessimism reduction contribution from each CAG as follows:

$$R_p = \sum_{g=1}^{G} R^g \quad (8)$$

where Rp is the cumulative pessimism reduction contribution from gth group and G is the total number of CAGs considered.

Also, because only logic correlation caused by buffers/inverters is considered, each CAG will have a tree-like logic connection structure, e.g., all aggressor nets in a group will share the same base net as the root of the net tree. For example, as shown in the FIG. 4, aggressor a1 will be the base net the CAG formed by 5 aggressors a1 to a5. So each CAG can be represented by its base net and we will have and only have three transition combinations: base net rise/quiet/fall. Once the transition of the base net is given, all aggressors in the CAG will then be determined.

The independency between different CAGs may also relax the CDF computation of the path pessimism reduction in the way that the CDF can be simply convolved from each individual CDF for every CAG.

In an embodiment, the analysis to compute the overall path pessimism reduction RP is simplified into two sub-analysis actions: (1) compute the minimum path pessimism reduction for each CAG and each transition of the CAG root net following equation (7) where net k is the root net of the CAG and (2) sum up the path pessimism reductions from all CAGs as equation (8)

The first action (1) may be a more significant issue since action (2) is a simple summation. In another embodiment, CAG's path pessimism reduction from the pessimism reduction contribution of each individual aggressor is constructed.

Pessimism Reduction Curve (PRC)

The rhs of the equation (7) is the pessimism reduction for an aggressor/victim pair, which is a function of the arrival time difference between the aggressor and victim if transition directions are fixed. Such a function, called pessimism reduction curve (PRC), is computed, in one embodiment, using Spice simulation by varying the aggressor alignment around the worst-case value.

After all PRCs for every individual pair of aggressor/victim are computed, the PRC is associated with a CAG, where the PRC is defined as the pessimism reduction from a CAG expressed as the function of the arrival time of the base net of the CAG.

To compute the PRC for a CAG from PRCs of the individual aggressors in the CAG, two operations for PRCs are involved: ADD and MERGE. ADD operation computes the PRC of cumulative pessimism reduction of a single aggressor if it attacks multiple victims on the critical path and the MERGE operation computes the PRC of the CAG from PRCs of aggressor's in the CAG.

ADD (Single Aggressor Attacks Multiple Victims)

Figure 5:
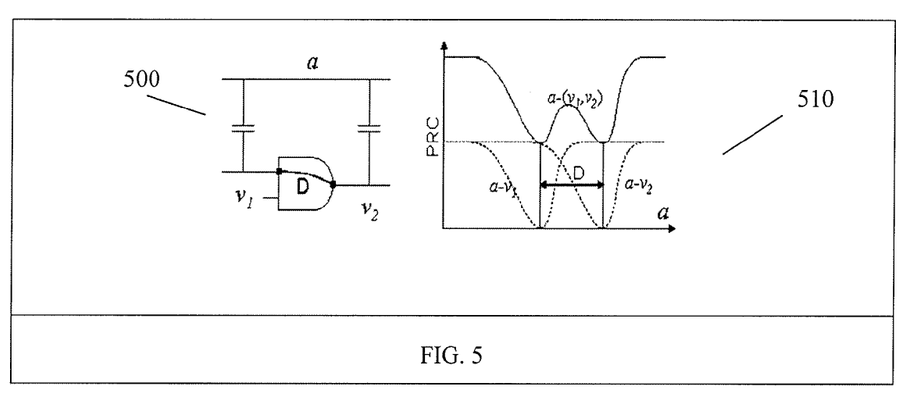
FIG. 5 illustrates when a single aggressor attacks multiple victims according to an embodiment of the present invention.

FIG. 5 illustrates an aggressor attacking two victims. In one embodiment, the combined PRC of the aggressor for two victims is simply a sum of the two individual PRCs when they are shifted by a time difference between the victims' arrival times D. The following table shows an example of possible results for this type of analysis:

TABLE 1

| Pessimism Reduction Experiment Results | | | | | | | | |
|---|---|---|---|---|---|---|---|---|
| | c1 | c2 | c3 | c4 | c5 | c6 | c7 | c8 |
| Number of Cells | 15653 | 32054 | 38852 | 41994 | 66458 | 308372 | 886818 | 1341482 |
| Number of Nets | 15890 | 142544 | 39350 | 43185 | 63958 | 310007 | 897952 | 1355690 |
| Paths Simulated | 65 | 447 | 1000 | 1000 | 1000 | 1000 | 1000 | 60 |
| Total CPU(s) | 953 | 1764 | 3207 | 2788 | 2756 | 9072 | 18971 | 21091 |
| NPPR CPU(s) | 63 | 204 | 1455 | 610 | 489 | 1940 | 840 | 302 |
| Runtime Penalty | 6.6% | 1.3% | 45% | 22% | 18% | 21% | 4.4% | 1.4% |
| total SI(ps) | 54750 | 47050 | 556320 | 272110 | 733160 | 477750 | 330610 | 82650 |
| NPPR (ps) | 6265 | 8054 | 61489 | 23001 | 65769 | 33763 | 38518 | 8089 |
| Reduction Rate | 11% | 17% | 11% | 8% | 9% | 7% | 12% | 10% |

Merge (Multiple Correlated Aggressors)

With the ADD operation, the PRC for each aggressor's contribution to the entire critical path is computed. If two aggressors are in the same CAG, then the MERGE operation combines the PRCs for the two aggressors to form a new PRC. If the MERGE operation is done iteratively through all aggressors in the CAG, the overall PRC for the CAG can then be computed.

When two PRCs from two correlated aggressors a1 and a2, with arrival times t1 and t2, are merged, the difference between t1 and t2 will be the delay between these two aggressors and is usually a range of values: $Dmin \leq t2-t1 \leq Dmax$. So for each specific arrival time of t1, the a2 can arrive at any time within the range of $t1+Dmin \leq t2 \leq t1+Dmax$.

In order to get the minimum pessimism reduction among all possible combinations of t1 and t2, the MERGE operation between these two aggressors is defined as in one embodiment:

> MERGE PRC from a2 to a1: Increase the PRC value
> of a1 at every t1 with the minimum value of the
> a2's PRC between t1+Dmin and t1+Dmax For all aggressors in a CAG, the MERGE operation is done in the order of from leaf to the root in the connection tree. For example, for the CAG shown in FIG. 4, the MERGE operation is done sequentially as: from a5 to a3, from a3 to a2, from a4 to a2 and finally from a2 to a1.

Figure 6:
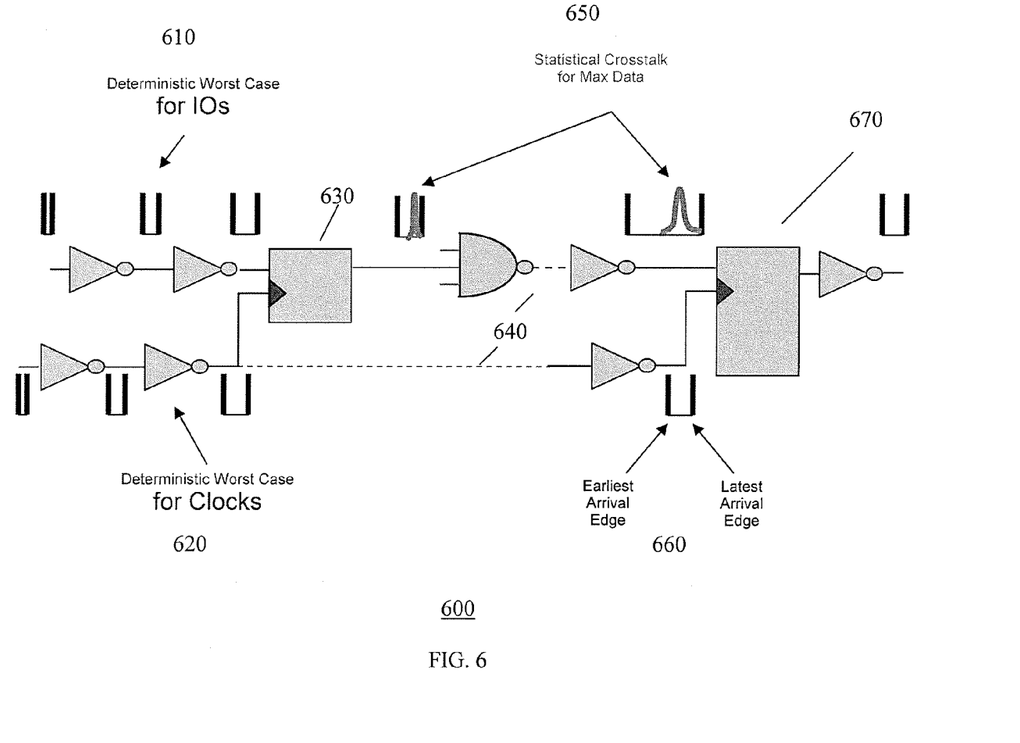
FIG. 6 illustrates portions of a design where a statistical crosstalk delay model can be applied according to an embodiment of the present invention.

FIG. 6 illustrates portions of an example design where a statistical crosstalk delay model can be applied. According to one embodiment, the statistical crosstalk path delay is applied only to flop-to-flop setup time checks, though the disclosure is not limited to this particular usage model. The above sections describe where statistical crosstalk path delay significantly reduces pessimism and computations can be performed using N*Root of the sum of the squares of each aggressor's contribution. However, one drawback is dependence on path enumeration, which makes it difficult for a commercial analysis tool. The challenge is to map the statistical model into the BFS timing model, without too much loss of accuracy. According to one embodiment, one basic assumption is that STA paths are feasible, that is, there is no targeting the false path problem. Provided that the paths are feasible, embodiments use propagation of crosstalk delay probability distributions through the critical logic cone, where additional aggressors cause the crosstalk delay distribution to be recalculated.

In one embodiment, deterministic worst case for IOs 610 and clocks 620 are determined. The path that the signal travels will add delay which will spread the time difference (e.g., illustratively shown by the bars and the delay is the space between them). Crosstalk will speed up/slowdown the transition which results in varying the time difference between possible initial and end of the signals.

The timing flip-flop 630 is well known in the art. It compares the data and clock signal and essentially functions by checking timing violation.

The signals may travel a long distance 640 which will increase the spread of probable delay. This can be calculated using statistical crosstalk for max data 650. Clock signal 660 after traveling a long distance 640 also has an earliest arrival edge and a latest arrival edge. The second flip-flop 670 checks for timing violation by ensuring the acceptable statistical crosstalk data are within the clock signal. As a result, the range for the IO signals are still for an acceptable range and the constraints are more relaxed than the worst case situation.

The following sections describe two example methods of performing statistical delta-delay analysis.

BFS-Based Method (Breadth First Search)

The probability for each aggressor is denoted to be Quiet, Rise or Fall by pq, pr, pf, respectively. These values can be obtained from switching probability computation similar to what is being done in power analysis. Using the probability of switching of each aggressor and contribution of each aggressor into the delta delay on the victim we build a Probability Distribution Function (PDF) of the delta delay on the particular pin. Once a PDF for each aggressor is computed, all are combined into a single PDF through convolution. In addition, the total PDF of all aggressors is convolved with a PDF propagated from previous stages. In order words, there are two atomic operations defined on PDF's: ADD and MAX.

With ADD operation one can determine a PDF for delta delay on a net using PDF for delta delay from previous stages and the PDF due to crosstalk on the given stage. With MAX operation one propagates two or more PDFs on inputs of a gate to its output. Note that the MAX operation is used with on gates with multiple inputs.

Figure 7:
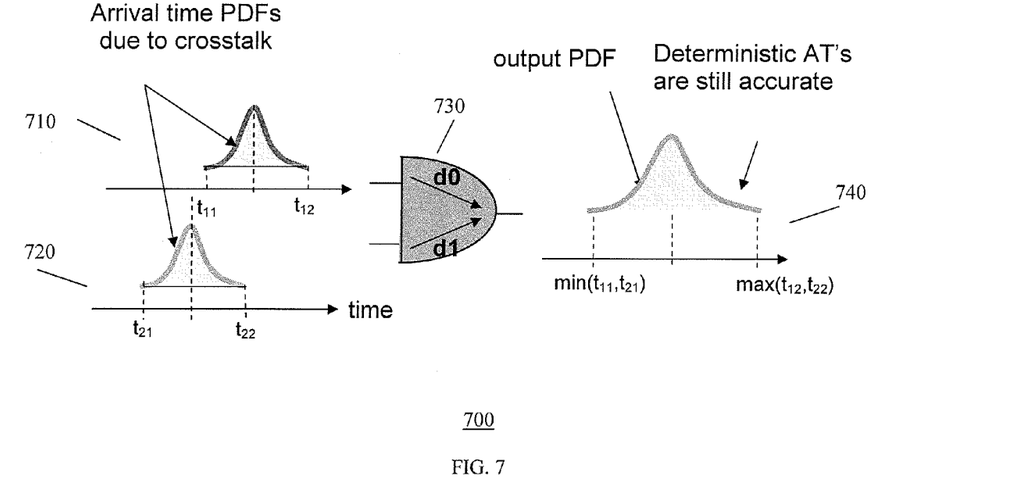
FIG. 7 illustrates two PDFs on inputs of an AND gate are used to generation a worst-case PDF at the AND's output according to an embodiment of the present invention.

FIG. 7 illustrates two PDFs at the inputs of an AND gate. In one embodiment, the AND gate is used to generation a worst-case PDF at the AND's output. The first PDF 710 has a minimum arrival time of t11 and a maximum arrival time of t12. The second PDF 720 has a minimum arrival time of t21 and a maximum arrival time of t22. At the output of the AND gate, the worst case PDF will have a minimum arrival time that is the smaller of t11 and t21 and the maximum arrival time that is the larger of t12 and t22.

Figure 8:
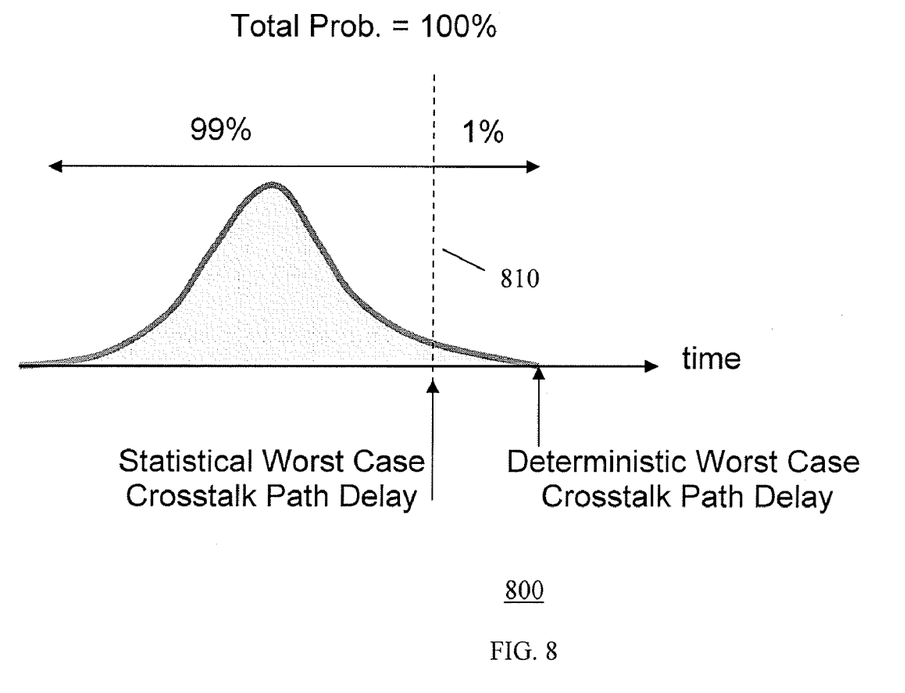
FIG. 8 illustrates the distribution probability of crosstalk path delay according to an embodiment of the present invention.

Referring to FIG. 8, once the distribution reaches the flop data input, the statistical latest arrival time is determined by the time realized with certain probability (e.g. 3 sigma). In one embodiment, easier convergence may be accomplished by relaxing the time constraint. By finding the derivative by determining the PDF of CDF, the time can be shifted to the left and set the statistical worst case crosstalk path delay at 99% 810. As a result, this enhancement allows for a more relaxed crosstalk path delay analysis.

Figure 9:
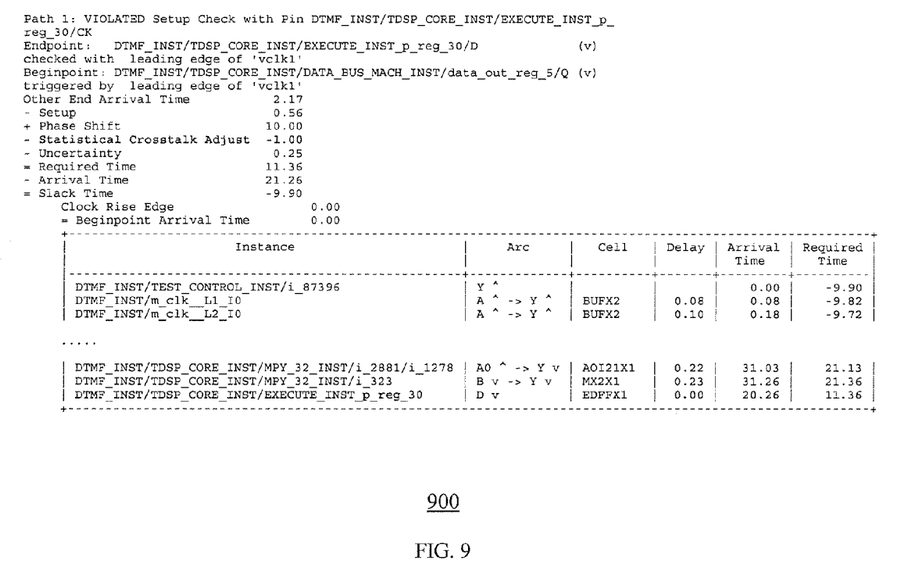
FIG. 9 shows an example of a report timing output with the statistical crosstalk delay adjustment on the flop input according to an embodiment of the present invention.

FIG. 9 shows an example of a report timing output after this enhancement, with the statistical crosstalk delay adjustment on the flop input.

DFS-Based Method (Depth First Search)

A second approach is based on path enumeration which is known to be np-complete. However, is can be efficiently applied to few top critical paths in order to reduce the pessimism of the STA (static timing analysis). With this approach the contributions from each aggressor of the path is computed, and all the aggressor contributions along the path are combined into a single PDF for the path via a convolution procedure. This approach results in a more accurate result for the given path than BFS approach since no MAX operation needs to be done.

Figure 10:
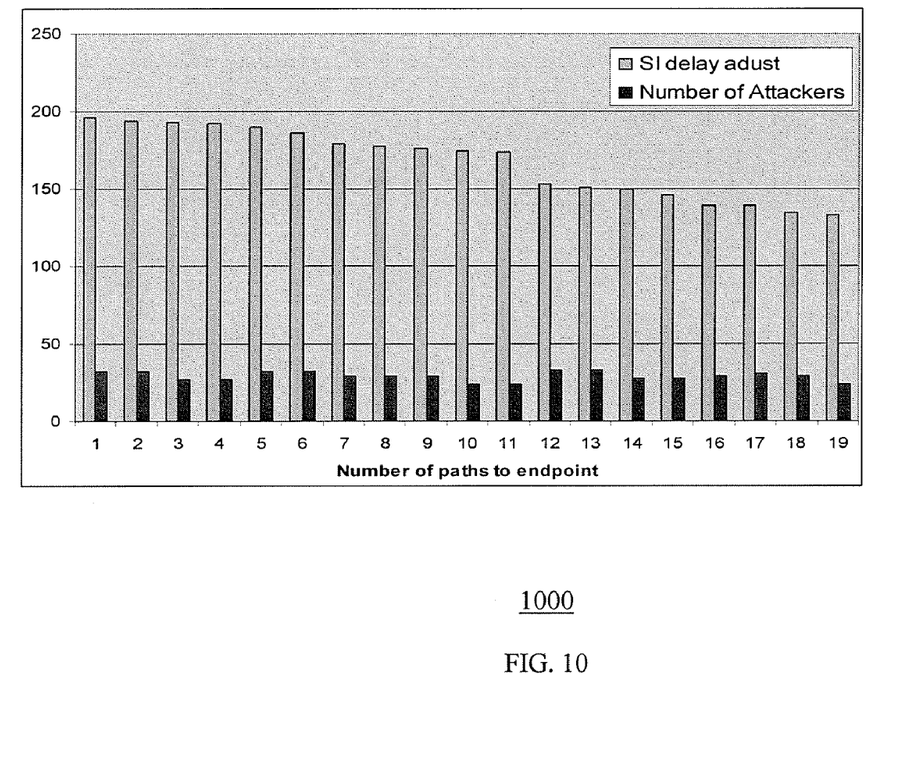
FIG. 10 depicts a bar graph having adjustments to the slack for each path to the endpoint according to an embodiment of the present invention.

FIG. 10 shows the adjustment to the slack for each path to the endpoint. The combined effect of multiple aggressor nets on a victim nets is not linear in general. That is, the overall crosstalk on the victim is not a simple summation of all aggressors' crosstalk on the victim when they are considered individually. In reality, the non-linearity is very significant.

In one present implementation, such a non-linear problem is solved by introducing the idea of pessimism reduction. The worst-case crosstalk is first computed using the existing method. Any perturbation to the aggressor/victims will then result on some type of crosstalk reduction, i.e. pessimism reduction. It is found that the pessimism reduction can be linearly computed—overall pessimism reduction from multiple aggressors can be approximated by the summation of the crosstalk from individual aggressors.

Figure 11:
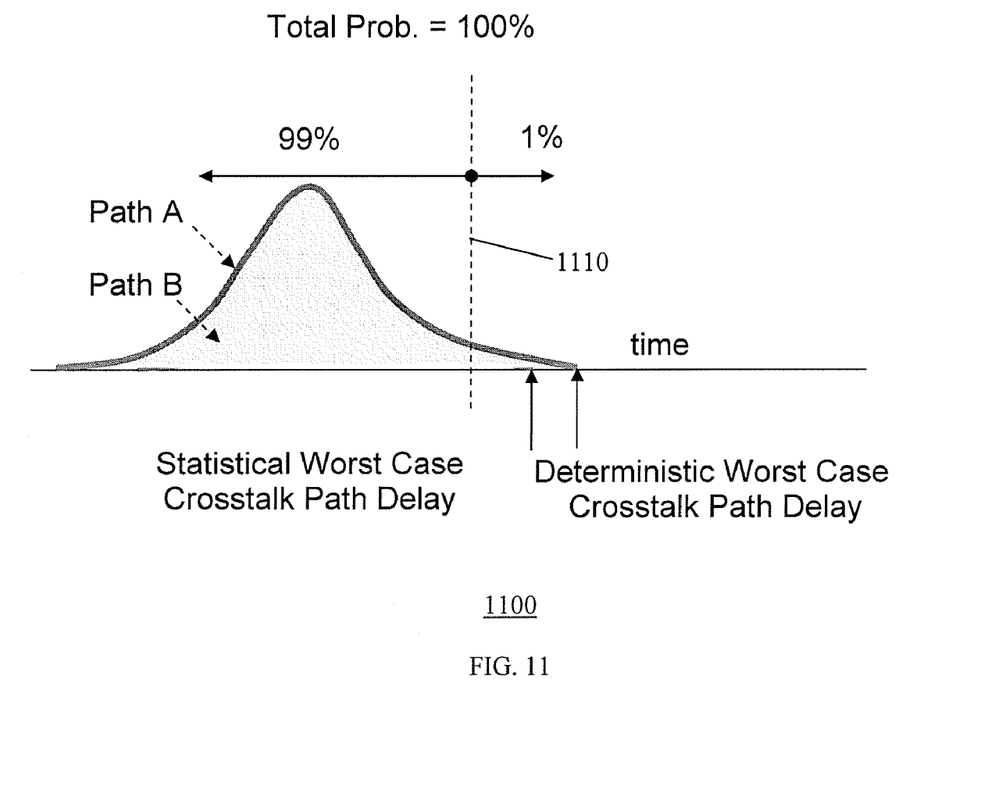
FIG. 11 depicts a graph of applying correlation to attackers on the path according to an embodiment of the present invention.

FIG. 11 illustrates applying correlation to attackers on the path. To account for the logical correlation, all crosstalk attackers to all nets in a DFS timing path is grouped based on their logical connections. Within the same group, nets are logically correlated and the comprehensive PDF of the group of nets is computed. All PDFs from different groups are then convolved to get the final DFS path end point PDF.

Logical correlation will also cause timing correlation. Two logically correlated nets cannot both switch at arbitrary time. Their switch times have to be differed by the amount of the time delay between these nets. By considering the timing correlation among the nets in a group, additional pessimism reduction can be realized.

Due to the logical/timing correlation between nets, the computation of the overall crosstalk of the correlated net group on the path becomes no longer linear even after the previous idea of pessimism reduction is applied: the crosstalks on different victim nets are dependent on each other. To deal with this, we employ a non-linear optimization algorithm to solve the non-linear problem.

Figure 12:
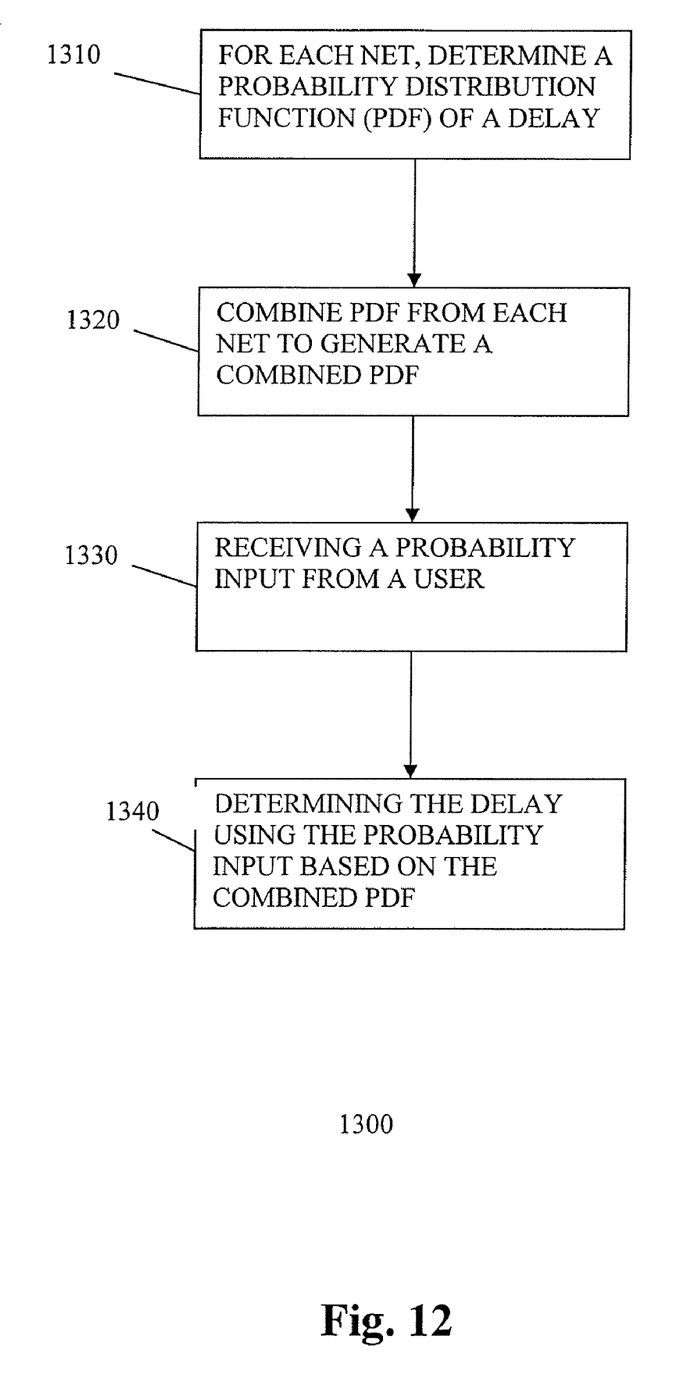
FIG. 12 depicts a flow chart illustrating analyzing delay according to an embodiment of the present invention.

FIG. 12 depicts a flow chart illustrating analyzing delay according to an embodiment of the present invention.

At 1310, a probability distribution function (PDF) of a crosstalk delay is determined for each of a plurality of nets. This determination may be performed as described above and with other methods that are known in the art.

At 1320, PDF from each net is combined to generate a combined PDF. At 1330, a user selects a desired probability level. The level may relax the constraints to the system and increase the ease of convergence.

At 1340, the crosstalk delay using the desired probability level based on the combined PDF is used to determine the statistical worst case cross path delay. In one embodiment, this level is determined using breadth first search (BFS). In another embodiment, this level is determined using depth first search (DFS). Any suitable approach to determining the desired delay may be used.

Figure 13:
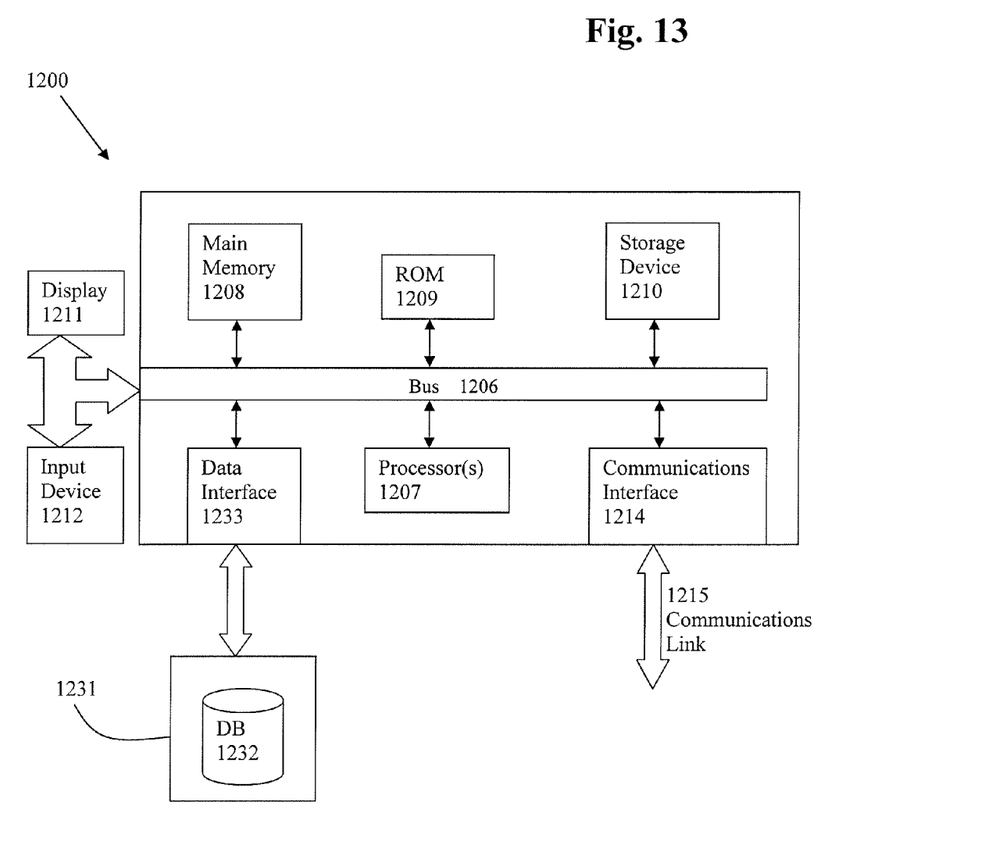
FIG. 13 depicts an exemplary computerized system on which a method based on the present invention can be implemented.

FIG. 13 depicts a computerized system on which a method based on embodiments of the present invention can be implemented. The execution of the sequences of instructions required to practice the embodiments may be performed by a computer system 1200 as shown in FIG. 13. In an embodiment, execution of the sequences of instructions is performed by a single computer system 1200. According to other embodiments, two or more computer systems 1200 coupled by a communication link 1215 may perform the sequence of instructions in coordination with one another. Although a description of only one computer system 1200 will be presented below, however, it should be understood that any number of computer systems 1200 may be employed to practice the embodiments.

A computer system 1200 according to an embodiment will now be described with reference to FIG. 12, which is a block diagram of the functional components of a computer system 1200. As used herein, the term computer system 1200 is broadly used to describe any computing device that can store and independently run one or more programs.

Each computer system 1200 may include a communication interface 1214 coupled to the bus 1206. The communication interface 1214 provides two-way communication between computer systems 1200. The communication interface 1214 of a respective computer system 1200 transmits and receives electrical, electromagnetic or optical signals, which include data streams representing various types of signal information, e.g., instructions, messages and data. A communication link 1215 links one computer system 1200 with another computer system 700. For example, the communication link 1215 may be a LAN, in which case the communication interface 1214 may be a LAN card, or the communication link 1215 may be a PSTN, in which case the communication interface 1214 may be an integrated services digital network (ISDN) card or a modem, or the communication link 1215 may be the Internet, in which case the communication interface 1214 may be a dial-up, cable or wireless modem.

A computer system 1200 may transmit and receive messages, data, and instructions, including program, i.e., application, code, through its respective communication link 1215 and communication interface 1214. Received program code may be executed by the respective processor(s) 1207 as it is received, and/or stored in the storage device 1210, or other associated non-volatile media, for later execution.

In an embodiment, the computer system 1200 operates in conjunction with a data storage system 1231, e.g., a data storage system 1231 that contain a database 1232 that is readily accessible by the computer system 1200. The computer system 1200 communicates with the data storage system 1231 through a data interface 1233. A data interface 1233, which is coupled to the bus 1206, transmits and receives electrical, electromagnetic or optical signals, which include data streams representing various types of signal information, e.g., instructions, messages and data. In embodiments, the functions of the data interface 1233 may be performed by the communication interface 1214.

Computer system 1200 includes a bus 1206 or other communication mechanism for communicating instructions, messages and data, collectively, information, and one or more processors 1207 coupled with the bus 1206 for processing information. Computer system 1200 also includes a main memory 1208, such as a random access memory (RAM) or other dynamic storage device, coupled to the bus 1206 for storing dynamic data and instructions to be executed by the processor(s) 1207. The main memory 1208 also may be used for storing temporary data, i.e., variables, or other intermediate information during execution of instructions by the processor(s) 1207.

The computer system 700 may further include a read only memory (ROM) 1209 or other static storage device coupled to the bus 1206 for storing static data and instructions for the processor(s) 1207. A storage device 1210, such as a magnetic disk or optical disk, may also be provided and coupled to the bus 1206 for storing data and instructions for the processor(s) 707.

A computer system 1200 may be coupled via the bus 1206 to a display device 1211, such as, but not limited to, a cathode ray tube (CRT), for displaying information to a user. An input device 1212, e.g., alphanumeric and other keys, is coupled to the bus 1206 for communicating information and command selections to the processor(s) 1207.

According to one embodiment, an individual computer system 1200 performs specific operations by their respective processor(s) 1207 executing one or more sequences of one or more instructions contained in the main memory 1208. Such instructions may be read into the main memory 1208 from another computer-usable medium, such as the ROM 1209 or the storage device 1210. Execution of the sequences of instructions contained in the main memory 1208 causes the processor(s) 1207 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1207. Such a medium may take many forms, including, but not limited to, non-volatile and volatile media. Non-volatile media, i.e., media that can retain information in the absence of power, includes the ROM 1209, CD ROM, magnetic tape, and magnetic discs. Volatile media, i.e., media that can not retain information in the absence of power, includes the main memory 1208.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

What is claimed is:

1. A computer implemented method of crosstalk analysis, comprising:

using a computer system which comprises at least one processor and is configured for performing a process comprising:

identifying a set of nets in a design;

determining, for each net of the set in a path in the design, a probability distribution function (pdf) of a crosstalk delay for the each net of the set, wherein the probability distribution function corresponds to one or more aggressors that contribute to the crosstalk delay;

generating a combined or composite probability distribution file for the path that combines probability distribution functions from nets along the path;

receiving a desired probability level from a user, and determining a statistical crosstalk path delay for the path using the desired probability level according to the combined or composite probability distribution file.

2. The computer implemented method of claim 1, wherein the probability distribution functions include contributions from the all nets along the path, and the probability distribution functions are combined or composited into the combined or composite probability distribution file via a convolution procedure.

3. The computer implemented method of claim 1, further comprising computing a worse-case crosstalk delay for the path.

4. The computer implemented method of claim 3, further comprising linearly computing a pessimism reduction for the each net in the set.

5. The computer implemented method of claim 4, further comprising determining an overall pessimism reduction for the path that is approximated by a summation of the crosstalk delay from the all nets along the path.

6. The computer implemented method of claim 1, further comprising using a non-linear optimization algorithm in the act of determining a statistical crosstalk path delay for the path.

7. The computer implemented method of claim 1, wherein the process is not based on a deterministic model of the design.

8. The computer implemented method of claim 1, further comprising:
separating one or more statistical checks from one or more deterministic checks within the design.

9. A system for crosstalk analysis, comprising:
a computer system which comprises at least one processor and is configured for performing a process comprising:
identifying a set of nets in a design;
determining, for each net of the set in a path in the design, a probability distribution function (pdf) of a crosstalk delay for the each net of the set, wherein the probability distribution function corresponds to one or more aggressors that contribute to the crosstalk delay;
generating a combined or composite probability distribution file for the path that combines probability distribution functions from nets along the path;
receiving a desired probability level from a user, and
determining a statistical crosstalk path delay for the path using the desired probability level according to the combined or composite probability distribution file.

10. The system of claim 9, wherein the probability distribution functions include contributions from the all nets along the path, and the probability distribution functions are combined or composited into the combined or composite probability distribution file via a convolution procedure.

11. The system of claim 9, the computer system is further configured for computing a worse-case crosstalk delay for the path.

12. The system of claim 11, the computer system is further configured for linearly computing a pessimism reduction for the each net in the set.

13. The system of claim 12, the computer system is further configured for determining an overall pessimism reduction for the path that is approximated by a summation of the crosstalk delay from the all nets along the path.

14. The system of claim 9, the computer system is further configured for using a non-linear optimization algorithm in the act of determining a statistical crosstalk path delay for the path.

15. A computer-readable storage medium comprising an executable program which, when executed by a computer system, causes the computer system to execute a process for crosstalk analysis, the process comprising:
using the computer system which comprises at least one processor and is configured for performing a process comprising:
identifying a set of nets in a design;
determining, for each net of the set in a path in the design, a probability distribution function (pdf) of a crosstalk delay for the each net of the set, wherein the probability distribution function corresponds to one or more aggressors that contribute to the crosstalk delay;
generating a combined or composite probability distribution file for the path that combines probability distribution functions from nets along the path;
receiving a desired probability level from a user, and
determining a statistical crosstalk path delay for the path using the desired probability level according to the combined or composite probability distribution file.

16. The computer-readable storage medium of claim 15, wherein the probability distribution functions include contributions from the all nets along the path, and the probability distribution functions are combined or composited into the combined or composite probability distribution file via a convolution procedure.

17. The computer-readable storage medium of claim 15, the process further comprising computing a worse-case crosstalk delay for the path.

18. The computer-readable storage medium of claim 17, the process further comprising linearly computing a pessimism reduction for the each net in the set.

19. The computer-readable storage medium of claim 18, the process further comprising an overall pessimism reduction for the path that is approximated by a summation of the crosstalk delay from the all nets along the path.

20. The computer-readable storage medium of claim 15, the process further comprising using a non-linear optimization algorithm in the act of determining a statistical crosstalk path delay for the path.

* * * * *